United States Patent [19]

Nhuyen et al.

[11] Patent Number: 5,379,308
[45] Date of Patent: Jan. 3, 1995

[54] APPARATUS FOR A BUS-BASED INTEGRATED CIRCUIT TEST ARCHITECTURE

[75] Inventors: Hang T. T. Nhuyen, Mesa; Srinivas Raman, Phoenix, both of Ariz.

[73] Assignee: Intel Corporation, Santa Clara, Calif.

[21] Appl. No.: 870,877

[22] Filed: Apr. 20, 1992

[51] Int. Cl.⁶ .......................................... H04B 17/00
[52] U.S. Cl. .................... 371/22.6; 371/22.1
[58] Field of Search ............ 371/22.6, 22.5, 22.3, 371/22.1, 15.1; 324/73.1

[56] References Cited

U.S. PATENT DOCUMENTS

5,173,904  12/1992  Daniels et al. .................. 371/22.3
5,210,759  5/1993   DeWitt et al. .................. 371/22.3

Primary Examiner—Robert W. Beausoliel, Jr.
Assistant Examiner—Phung My Chung
Attorney, Agent, or Firm—Blakely, Sokoloff Taylor & Zafman

[57] ABSTRACT

The present invention provides an access mechanism for the testing of modules within an integrated circuit. A test access architecture is implemented which allows embedded testing of reusable modules with reusable test vectors regardless of the configuration of the integrated circuit. Modules within the integrated circuit may receive previously developed test vectors directly from a test input bus without having to propagate them through intervening modules. The module is controlled to accept as input either normal system inputs or the previously developed test vectors by logic circuits embedded within each module. The module's output is routed by a test output bus for dynamically observing test results at the system pins.

10 Claims, 8 Drawing Sheets

APPARATUS FOR A BUS-BASED INTEGRATED CIRCUIT TEST ARCHITECTURE

BACKGROUND OF THE INVENTION

1. Field of Invention

The present invention relates to an apparatus for efficient testing of modules within integrated circuits. More particularly, the present invention provides an access scheme for efficient testing of standard modules within integrated circuits using previously developed module test vectors regardless of the configuration of the modules within the integrated circuit.

2. Description of the Prior Art

Integrated circuits find application today in many areas far afield of their original domain in the computer industry. They can be found in devices from dishwashers and microwave ovens to planes, medical equipment and communications devices. Because proper functioning of embedded integrated circuits is often critical to the device in which they operate, it is essential that comprehensive testing be performed when they are being mass produced to ensure that the end product performs as designed, and is as fault and error free as possible. Thus, because every chip must be tested during production, test overhead becomes a serious concern for semiconductor manufacturers.

Obviously, as chip designs become more complex, the physical overhead and time required for testing can contribute enormously to the overall cost of the devices. For simple chip designs it is a simple matter to test the chip as a whole. A set of test inputs, the test vectors, are developed, and if the chip is in good condition, expected outputs will result from passing those inputs into the device. However, as integrated circuits become more densely packed and complicated, the development of the input test vectors for testing the majority or the circuitry becomes very difficult to develop and expensive to implement for every chip design. Further, testing chips as a whole makes it difficult to isolate problems that may be recurring frequently in a given batch.

Today, integrated circuit design has taken on a modular approach in which there are certain modules that will be common within many integrated circuits, though they may be configured differently. For example, common modules include timers, counters, digital-to-analog converter, central processing units (CPU), direct memory access controllers (DMA), etc. Application Specific Integrated Circuits (ASIC) will usually be built around different configurations of the same modules. However, the configuration of the modules within a given chip will determine what test vectors are required to implement a chip-as-a-whole testing scheme. Thus, even though two chips may contain exactly the same modular elements, their unique configurations may require the development of completely different testing schemes. This is so because many of the modules will be embedded within the chip such that there is no direct access to them and their inputs will be signals which have propagated through other modules prior to reaching them. For example, in one configuration, to test a timer might require developing test vectors that will have to pass through a CPU on their way to the timer and then have to be propagated through a counter on their way out of the chip. In addition to the arduous task of simulating the chip to determine the desired inputs to get desired outputs, a bad response won't guarantee that the problem is within the timer. The problem may be occurring within a CPU or a counter or at any other point between the input pins and the output pins.

Obviously the problem is exacerbated when the number of modules within the integrated circuit increases and the level of module embeddedness becomes deeper. If it were possible to access each module directly then a standard set of test vectors for that type of module could be implemented. That is, every counter of a particular type would receive exactly the same test vectors as inputs, and exactly the same results would be expected. The problem is that rarely is every module directly accessible for both inputs and outputs. It requires a tremendous amount of silicon overhead to design complex integrated circuits such that all modules are directly accessible to system pins in that manner. Thus, there is a need for a design scheme which provides for accessing modules to deliver standard test vectors and a way to gather those modules' outputs, but without the overhead of trying to design integrated circuits with direct pin access to every module's inputs and outputs.

SUMMARY OF THE INVENTION

An apparatus is disclosed which provides solutions to some of the above-mentioned limitations and disadvantages associated with conventional configuration-dependent testing of reusable modules within integrated circuits. The present invention provides a test access architecture for testing modules within an integrated circuit, particularly for those modules that are common in many systems and for which previously developed test vectors are available. Modules are tested by controlling their inputs at the module boundary and observing their outputs from the module boundary.

Each module in the system is provided at its boundaries with the invented test access circuitry to selectively control all module inputs and to control module operation while the system is in test mode. During normal system operation the test access architecture is fully disabled and contributes only a minimal delay to system operation. During module testing input test vectors are applied in parallel via a test input bus to the inputs of the module which has been selected to be the tested module. The outputs of the module are observed by means of a test output bus which conveys the module's output to selected pins. The test buses and the test control signals may have their own dedicated system pins or they may be multiplexed with other pins that are only needed during regular operation of the integrated circuit.

Therefore, it is an object of the present invention to provide a test access architecture scheme that allows embedded testing of generic reusable modules with previously developed module test vectors.

It is a further object of the present invention to provide a test access architecture scheme which can easily be implemented on custom-designed modules as well as standard modules.

It is also an object to provide the above with a minimum of silicon overhead and with minimal impact upon normal mode operation of the integrated circuit.

DETAILED DESCRIPTION OF THE INVENTION

Figure 1:
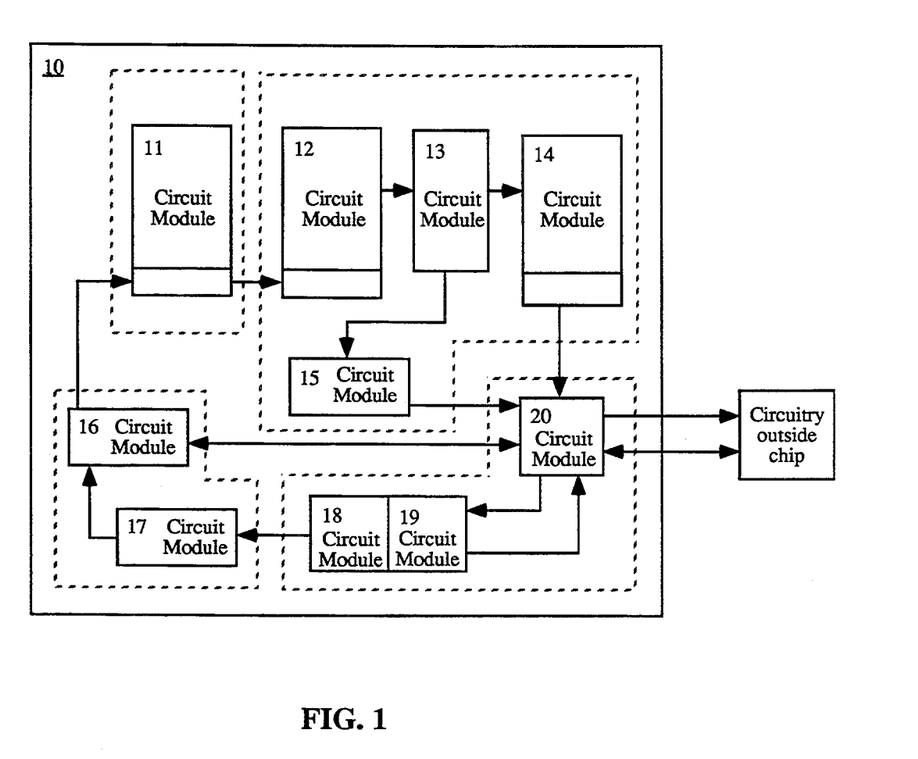
FIG. 1 is an overview of a general integrated circuit which has modularized circuitry.

Referring first to FIG. 1, a generic modularized integrated circuit 10 is shown. This generic chip shows one possible layout of a collection of discrete modules within an integrated circuit. As can be seen, the integrated circuit of FIG. 1 contains 9 modules 11–20. These modules, though not identified, may be any of the following: counters, timers, CPUs, DMA controllers, analog-to-digital converters, registers, or memories, etc. The lines shown connecting the different modules are the signal lines laid within the chip, thus, for example, module 12 is only in communication with modules 11 and 13 while module 14 is only in communication with modules 13 and 20.

As can be seen, the modularized integrated circuit 10 unrealistically shows only a single module 20 which communicates with the world outside of the chip. Thus, in order to test the module 14, it would be necessary to develop a set of test vectors which would have to propagate through modules 20, 19, 18, 17, 16, 11, 12, and 13 to yield the desired test inputs to the module 14. Then, the test result from the module 14 would have to be propagated through the module 20 to be routed out of the chip. Obviously, designing comprehensive test vectors for embedded modules can be an arduous and time-consuming task. Further, incorrect test outputs are difficult to attribute to a single faulty module and may require extensive investigation to identify defects.

When testing integrated circuits using the chip-as-a-whole method it is necessary to design test vectors for each module dependent upon both the module's physical location in the given configuration as well as its address map value. Thus, even though two modules might be identical devices such as counters, having the same circuitry, their physical location within the chip requires independent development of test vectors. Likewise, the address mapping of the modules would have to be incorporated into the test vectors so a different map address would require different test vectors. Because so many modules are used repeatedly in different configurations, it is desirable that it be possible to use transportable, previously developed test vectors for testing these modules. To do this requires a means of accessing the module directly with the desired test vectors and then a means to directly output the test results to an observation point.

Figure 2:
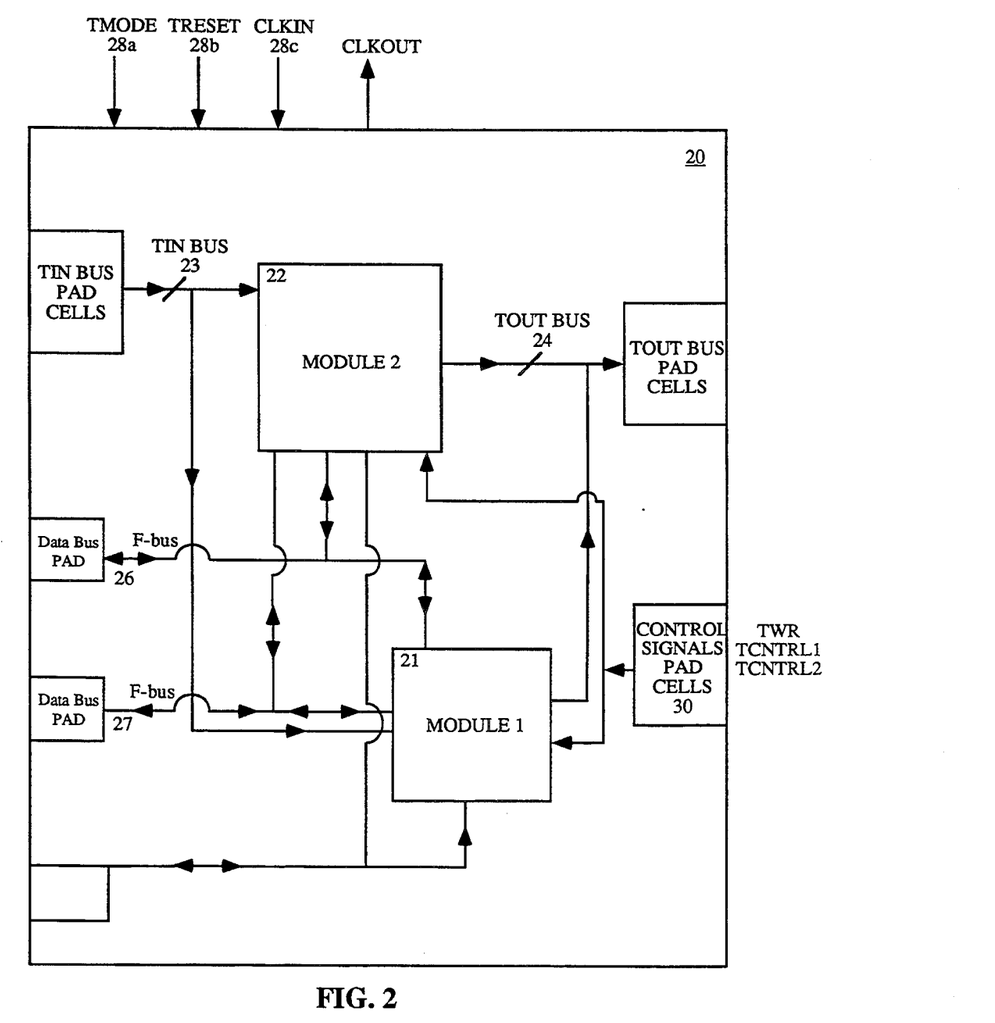
FIG. 2 is an overview of a general integrated circuitry with modularized circuitry with the test bus architecture of the present invention.

To accomplish the above-desired ability, modularized integrated circuits may be provided with the bus-based test architecture of the present invention. FIG. 2 shows a modularized integrated circuit 20, less crowded than the one shown in FIG. 1, with only two modules presented. In addition to the inputs and the two modules, FIG. 2 shows a number of lines representing signal lines connecting modules to one another as well as connecting modules to some primary inputs and outputs.

Two of the signal lines shown in FIG. 2 are the TINBUS 23 and the TOUTBUS 24. These are the test buses that run to each module, the TINBUS for driving the inputs and the TOUTBUS for conveying the test outputs when a selected module is being tested. The TINBUS provides an alternate input path to each module in addition to the module's normal user inputs. The TINBUS is first used to convey configuration information for controlling the chip's modules during test mode, then it is used for conveying test vectors to a module selected for testing. After the selected module's logic operates on the supplied test vectors, the test results are outputted from the module through its test system outputs to the TOUTBUS. The TOUTBUS conveys the test results to pins which have been designated for outputting test results to a specific point for dynamic observation. The test results may be dynamically observed at the system pins by means of an IC tester, oscilloscope, voltmeter, or any other suitable device.

The TINBUS supplies signals in parallel to the modules. The width of the TINBUS should be fixed such that it can accommodate the width of previously developed test vectors. In the preferred embodiment discussed herein, a bus width of eight (8) bits has been selected. This is of course a design preference, and those of ordinary skill in the art will realize that practically any width will work depending on considerations of silicon overhead and the like. Likewise, the TOUTBUS conveys test result signals in parallel from the modules to the TOUTBUS pad which may have its own pins or be multiplexed to pins that are only used during normal system operation. In the preferred embodiment described herein, a bus width of nine (9) bits has been selected for the TOUTBUS.

In addition to the two modules 21 and 22 and the test buses 23 and 24, the integrated circuit 20 of FIG. 2 shows the chip's normal internal data bus (also referred to as the F-bus), shown input from two pads 26 and 27. As shown in FIG. 2, this data bus runs to both modules. The internal data bus, the F-bus, is provided with direct access to each module's logic, even during testing, to provide address data and control signals used by the module during both normal mode operation and test. If the internal data bus were also to be used for conveying test vectors, the total number of signals to map would become very large; hence the need for the test buses 23 and 24 which run to all modules that need testing. Also shown coupled to integrated circuit 20 are three system inputs 28a, 28b and 28c. In the preferred embodiment, these are mandatory signals for providing the test mode signal, TMODE, a test mode reset signal, TRESET, and a system clock, CLKIN. Other mandatory signals are the TWR, TCNTRL1, TCNTRL2 for controlling the chip's modules during testing operations and configuration, shown at the control signals pad cells 30. While in the preferred embodiment some of these input pins are mandatory for providing their associated signals, those of ordinary skill in the art will easily envision configurations where separate test pins are not necessary. For example, regular system pins could serve multiple purposes or be multiplexed for providing test signals only during testing.

Figure 3:
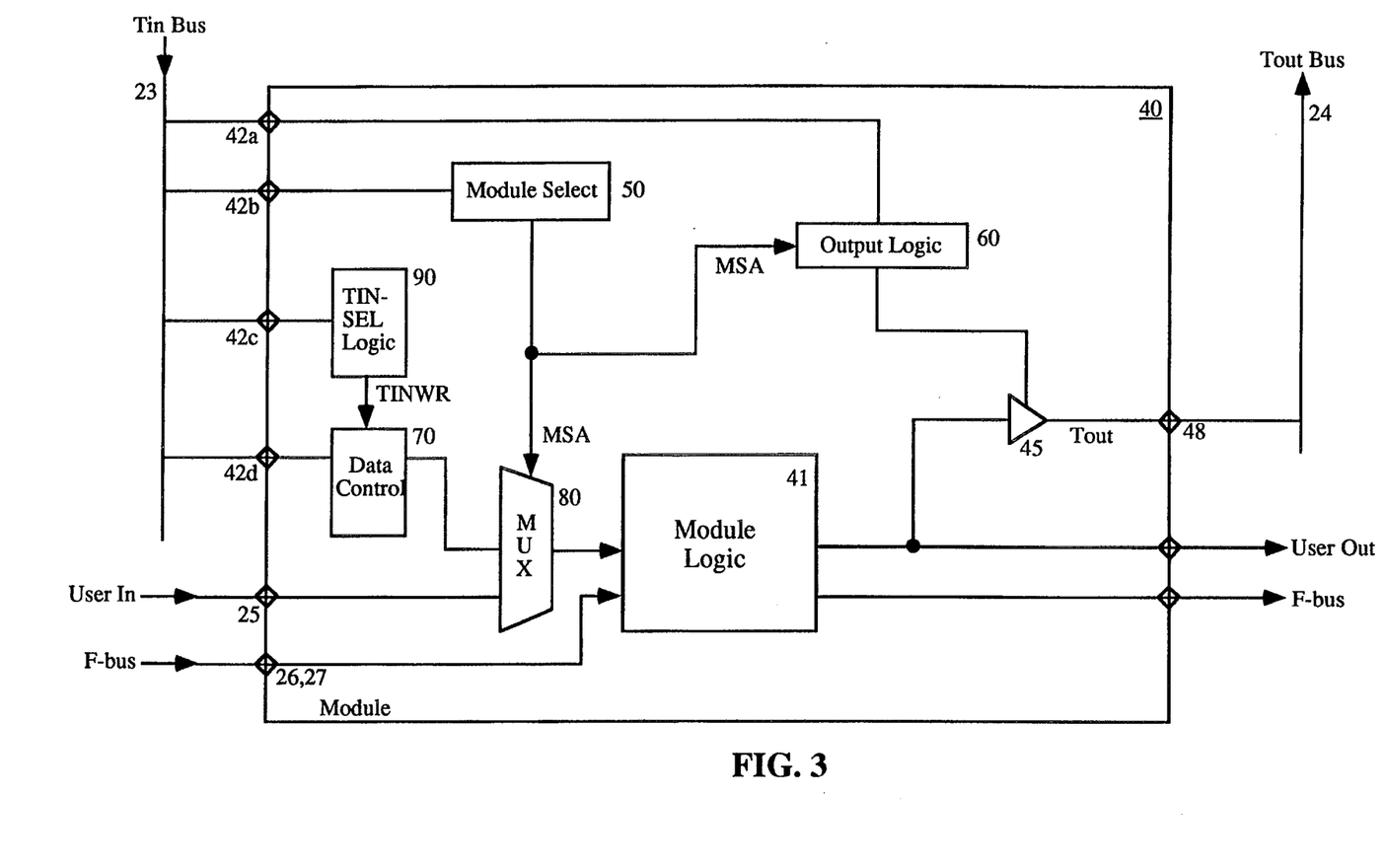
FIG. 3 is a block diagram of one module within the integrated circuit of FIG. 2 employing logic for providing the module with input test vectors from a test input bus, and for routing the module's outputs to a test output bus in accordance with a preferred embodiment of the present invention.

As indicated, the TINBUS is used for conveying both test configuration data as well as actual test vectors. In order to make use of the test buses, each module must have added to its circuitry the bus-based test architecture logic of the present invention. FIG. 3 shows the generalized logic circuit of the present invention added to a generic module 40. The module 40 contains module logic 41, which comprises the standard circuitry for whatever type of module that module 40 is. The remaining circuitry shown in FIG. 3 is a simplified logic representation of a preferred embodiment of the present invention. FIG. 3 shows both the TINBUS 23 and the TOUTBUS 24 coupled to the module. As described above, these are the test buses for conveying test data to and from the module when the integrated circuit is operating in a test mode.

The TINBUS 23 is shown providing inputs to the module 40 at four different locations, 42a, 42b, 42c and 42d. Each of these test system inputs receives parallel data having the same width as the TINBUS, in this case, 8 bits wide. The inputs from the TINBUS feed the test module select logic 50, the test output logic 60, the test input select logic 90 and provides the test input vectors through the test data control logic 70. The user and test inputs to the module logic 41 are driven through a multiplexing logic 80, while the on-chip address, data and control signals are driven directly from the F-bus 26.

The test input select logic 90 controls which portions of the test data control logic 70 are directly accessible to be driven by the test input bus 23. The multiplexing logic 80 receives as its inputs both the normal mode inputs from the module system inputs 25 and the test vector inputs that are passed through the test data control logic 70. The multiplexing logic passes only one of these two input signals through to the module logic 41. The signal to be passed is selected by the test module select logic 50. If the particular module has been configured such that it is the module being tested, then the test module select logic 50 provides a Module Select Active (MSA) signal in a high logic state to the multiplexing logic 80. If the multiplexing logic receives the MSA signal in a high logic state then it passes the test signals through to the module logic. If the MSA signal is in a low logic state then the multiplexing logic 80 passes the normal mode module input signals through to the module logic.

There is also shown in FIG. 3 a test output driver 45 for driving test results onto the TOUTBUS 24. The test output driver 45 is controlled by the test output logic 60. If the test output logic receives an MSA high signal and the appropriate identification signals were sent during the configuration cycle, then the test output driver is instructed to route the output from the module logic through the module's test system outputs 48 to the TOUTBUS 24. The TOUTBUS conveys the test result signal to a test system output pin for observation by any of the test observing means indicated above. More will be said about the various test logic circuits and the configuration for module testing in subsequent sections with reference to additional figures.

Figure 4:
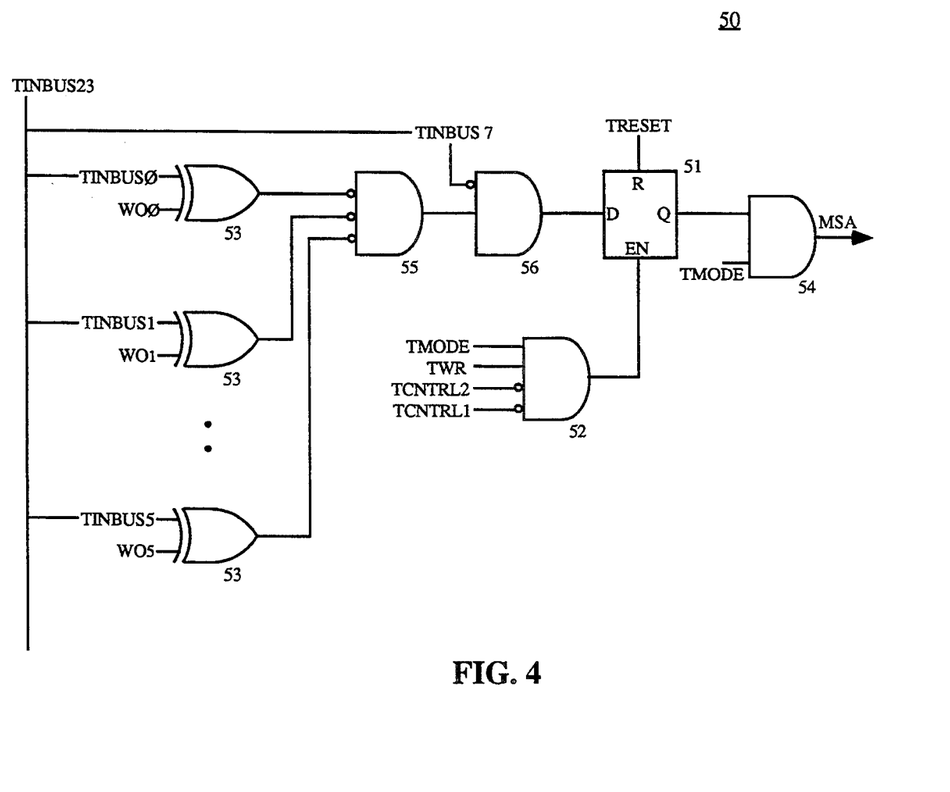
FIG. 4 is a more detailed logic diagram of the test module select logic from FIG. 3.

Referring next to FIG. 4, the test module select logic 50 is shown in greater detail. This circuitry will be discussed in conjunction with the procedure for configuring a module to be the module selected for testing. The test module select logic 50 comprises the following elements: module select register 51 (also called the TSEL register), TSEL control gate 52, module select address comparators 53, MSA control gate 54 and module address gates 55 and 56. Each module is controlled during testing configuration through this circuitry and each module is equipped with this logic.

When a chip is in RESET, it will ordinarily come up in a normal user operation mode. If the TMODE signal has been activated then the integrated circuit will enter test mode with no modules selected for testing. That is, all the TSEL registers are cleared during RESET. The TMODE signal must remain active throughout the testing process in the preferred embodiment of the present invention. When an integrated circuit is being configured for testing, it is also a good idea to have each module configured such that it does not write onto the main internal data bus. One way to do this is to tristate the outputs to the data bus (not shown). Of course, those of ordinary skill in the art will recognize that there are numerous way to accomplish this, or realize that in some cases it is not necessary.

In order to select a desired module for testing, an address code will be written via the TINBUS 23 to the test module select logic 50 on each module. To select the TSEL register as the one to be written to by the TINBUS, system pins TMODE and TWR must be set high and both TCNTRL1 and TCNTRL2 must be set low. A table will be included in a subsequent section showing which registers are selected by which control signals. When these four signals are set accordingly, the TSEL control gate 52 enables the TSEL register 51 to receive a module select active (MSA) enabling signal. Each module has a unique test address within a given chip configuration. Thus two identical counters in the same chip will have different test addresses. Note, that address zero is reserved because that is the address established when the chip is reset. That is, address zero indicates that no modules are selected. These addresses may be programmed as wire options within the module that are coupled to the module select address comparators 53 (shown as data lines $W_O$). The address data coming from the TINBUS is compared to the hard-wired address of each module via the comparators 53. The comparators 53 shown in FIG. 4 are exclusive NOR gates. Module address gates 55 and 56 respond to a matching address by latching a high logic value into TSEL register 51. For the module with the matching address, the MSA address gate 54 will output the MSA signal in a high logic state, thus activating that module as the module to be tested. The actual method of comparing addresses may be carried out in any way already known to those skilled in the art.

After a module has completed testing, the test module select logic 50 of each module may be addressed again to select the next module for testing. Modules may be tested in any order but it is recommended that the clock module (if there is one) be tested first because it will usually be supplying the remaining modules with its outputs.

Figure 5:
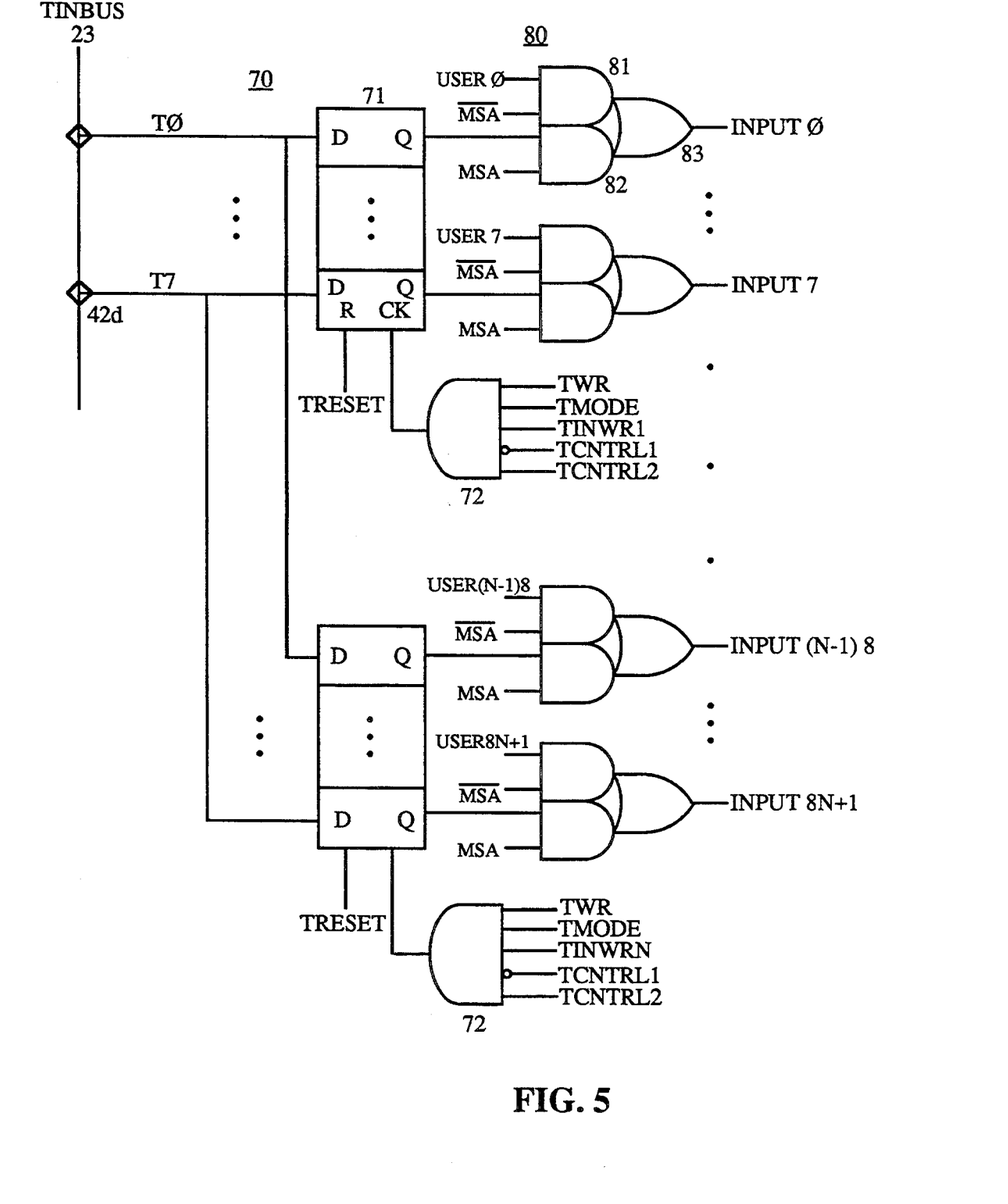
FIG. 5 is a more detailed logic diagram of the multiplexing logic for test input signals and normal module input signals for controlling a given module while it is being tested.

FIG. 5 shows in more detail the test data control logic 70 and the multiplexing logic 80. The test data control logic 70 comprises a test data register (TINREG) 71 and TINREG control gate 72. Test data is fed in parallel down the TINBUS 23 through test system inputs 42d into the latches of TINREG 71. In order for the TINBUS to write to the TINREG, it must be enabled for accepting data. This is done by the TINREG control gate 72 which enables the TINREG when the system signals TWR, TMODE and TCNTRL2 are set to high logic and TCNTRL1 is set low logic. Additionally, the TINWR signals from the test input select logic 90 control which portions of the TINREG may be driven directly by the TINBUS. Prior to this, the other TINREG inputs are set to values that are needed during the testing process. These prior set values will depend on the module that is being tested and the test that is being run.

The multiplexer logic 80 may comprise any number of logic arrangements known to those skilled in the art, but in the preferred embodiment is illustrated as having for each bit coming in two AND gates 81 and 82 and an OR gate 83. The AND gates 81 for each bit receive data from the normal module inputs and the MSA signal inverted. The AND gates 82 receive the data bits from the TINREG and the MSA signal unaltered. Thus, when MSA is high for a given module, the data coming from the TINREG is conveyed through the multiplexer logic 80 to the module logic 41. When the module is not the one being tested and/or the system is not in test mode, the inverted MSA signal will be high and the AND gates 81 will pass the normal module system inputs through the multiplexer logic 80 to the module logic. In the case where a module has more inputs than the TINBUS is wide, another register is used for selecting test sets for the module. This will be discussed in a subsequent section.

Figure 6:
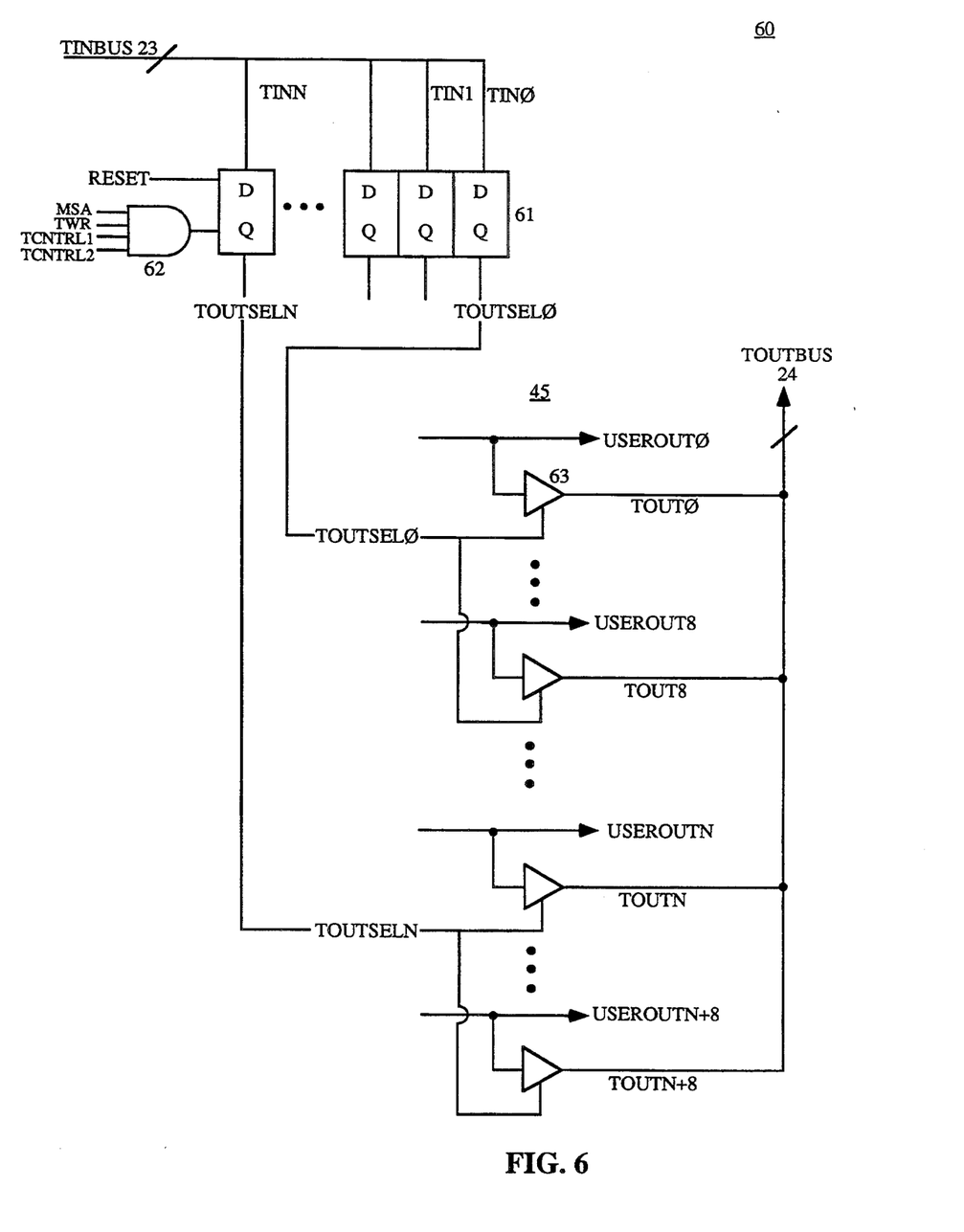
FIG. 6 is a detailed logic diagram of the output logic for driving the module's test results onto a test output bus for dynamically observing test results.

Referring next to FIG. 6 the procedure and circuitry for writing test result out via the TOUTBUS 24 will be described. For a module to be enabled to convey its outputs to the TOUTBUS it must be established during the configuration stage that that is what is planned for the particular module. During configuration, the TINBUS must write output driver control bits to the TOUTSEL register 61 of the module selected for testing. During RESET, all of the modules' TOUTSEL registers are cleared. In order to write a high logic state to all the desired bits of the TOUTSEL register 61 of the selected module, the TOUTSEL control gate 62 must be enabled. This gate receives four inputs, all of which must be to a high logic state. These include the MSA signal for indicating that the particular module is the module under test and the TWR, TCNTRL1 and TCNTRL2 test system control signals.

When the TOUTSEL control gate 62 has been enabled, the TINBUS 23 is able to write the output control data to the TOUTSEL register 61. The data in the TOUTSEL register is used to control the output driver 45. FIG. 6 show the output driver 45 expanded to individual drivers 63 for several of the output lines of the module. As discussed above, the TOUTBUS 24 has been selected to have a width of 9 bits. When there are more than nine module outputs that are required for generating the module's test results, TOUTSEL register 61 will be controlled to provide for testing of nine at a time. Thus, the test vectors will have to be passed to the module's logic for the number of times that there are a multiple of nine outputs. For each pass, a different set of nine outputs will be selected for routing of signals to the TOUTBUS until all have been tested. It is also possible, where there are less than nine outputs, to forego the use of a TOUTSEL register and have the MSA signal alone direct the output drivers. However, for the sake of uniformity it is suggested that all modules include the TOUTSEL register and implement the circuitry the same way.

FIG. 6 shows that the standard module outputs are coupled, one to each output driver, and that each output driver is further coupled to the TOUTSEL register 61. When the TOUTSEL register 61 has received control data in a high logic state, it passes those signals to the desired output drivers 63 which are then enabled for driving the module's outputs onto the TOUTBUS 24. From the TOUTBUS 24 the test result signals may be conveyed to the chip's test system pins and from there be dynamically observed by any of the means discussed above.

Figure 7:
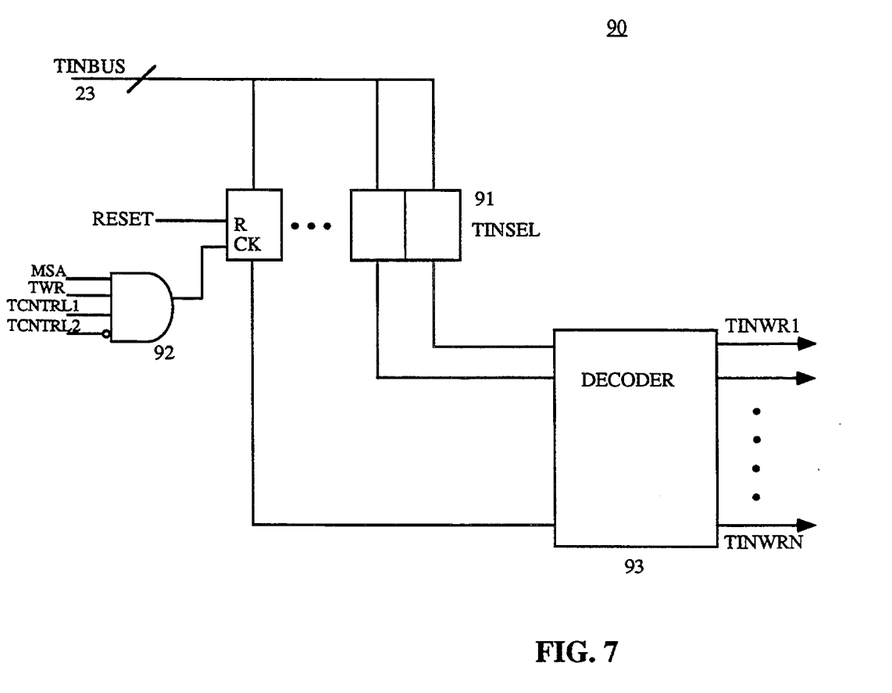
FIG. 7 is a detailed logic diagram of the test input select logic for selecting which bits of the test input register will be directly accessible by the test input bus.

As has been indicated above, there will be some modules that require more test vector width than the TINBUS is wide. A test set is defined as the number of bits visible at the module boundary at one time, in the case of the preferred embodiment here, 8 bits. For modules requiring more than one test set, another register is introduced, the TINSEL register for selecting between test sets. This is shown in FIG. 7. In order to control the TINSEL register 91 from the TINBUS, the TINSEL control gate 92 must be enabled. This is done by supplying to it the MSA and TWR signals and TCNTRL1 in a high logic state, while inverting the TCNTRL2 signal from a low logic state. The TINSEL register then drives the DECODER 93 which enables a set of 8 bits of the TINREG to be directly accessible from the TINBUS (the test set). The DECODER 93 is not needed if there are less than eight test sets. As noted above, prior to this the other inputs of the TINREG are set to values that are needed for the current testing process.

Switching between test sets comprises selecting a different set of 8 bits of the TINREG to be driven by the TINBUS. The switching of test sets is controlled by the TINSEL register and its associated control logic. Functional testing of the module can proceed at speed, or nearly at speed, except possibly when switching between test sets. If test sets are chosen intelligently, switching between them can be kept to a minimum. Switching among test sets can be accomplished with or without the clocks being halted. If the switching needs to occur within a short period of time and does not provide for appropriate setup and hold times, stopping the clock may be necessary in order to maintain the lock step nature of the input patterns. If the test set switching can occur over an extended number of clock cycles then the switching can occur dynamically with no reduction in testing speed.

Figure 8:
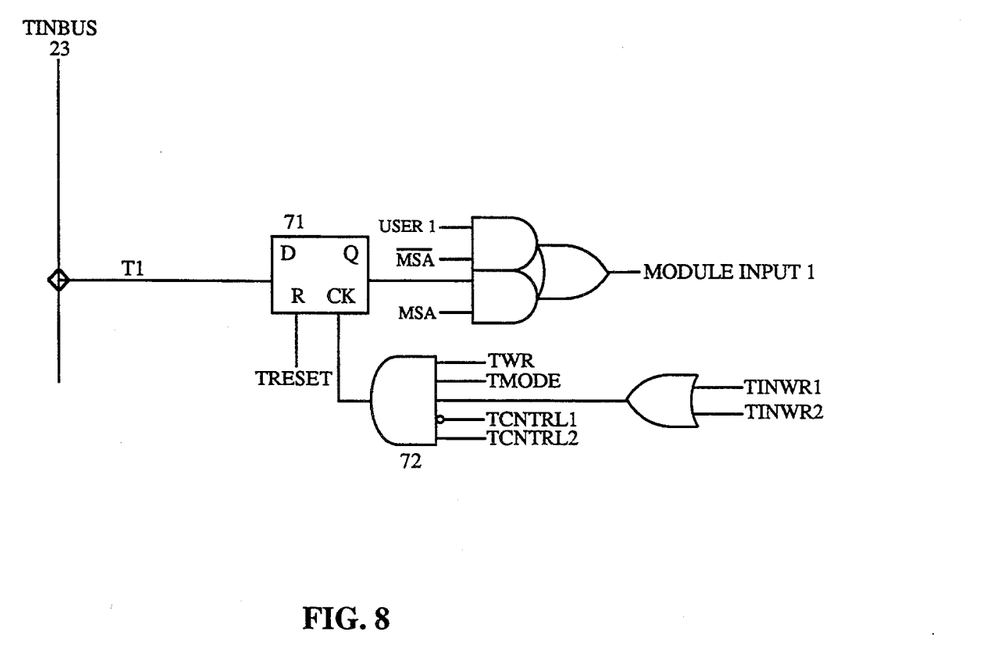
FIG. 8 is a detailed logic diagram of an alternative embodiment of the present invention where selected bits of the test input register will be actively driven by the test input bus in more than one test set.

One of the great advantages of the present invention is the ability to mix signals in test sets. That is, certain bits of the TINREG may be selected to be directly accessible to the TINBUS in more than one test set. This will be desirable where certain inputs to the module logic will need to be switched frequently to provide adequate testing. This can be seen in FIG. 8 where one bit of the TINREG 71 is selectively enabled by the TINWR signals output from the test input select logic 90. The test input select logic 90 is addressed to select frequently switched TINREG bits to be in more than one active test set. The configuration shown in FIG. 8 is similar to a portion of FIG. 5, but here, the TINREG control gate 72 is activated for the two test sets corresponding to either a TINWR1 or a TINWR2 signal. Thus, in this arrangement, module logic input 7 will be directly driven through the TINREG by the TINBUS for two different test sets as controlled by the test input select logic 90.

The mixing of test sets further reduces the number of times the clock will need to be stopped when switching between test sets. The fewer number of times the clocks have to be stopped, the closer to at speed the testing may run, thus saving test time and improving the reliability of the tests.

Throughout the above discussion there has been reference to a number of registers within the bus-based test architecture which are written to by the TINBUS. These registers are selectively written to based upon a number of system base control signals. The four control signals are locally decoded in each module to provide for selective writing to the test registers. Table I shows the cross-reference to what signals have to be set to write to which registers of the present invention.

TABLE I

| TMODE | TWR | TCNTRL2 | TCNTRL1 | Control |
| --- | --- | --- | --- | --- |
| 0 | X | X | X | No Register write |
| 1 | 0 | X | X | No Register write |
| 1 | 1 | 0 | 0 | Write to TSEL |
| 1 | 1 | 1 | 0 | Write to TINREG |
| 1 | 1 | 0 | 1 | Write to TINSEL |
| 1 | 1 | 1 | 1 | Write to TOUTSEL |

As indicated, the TSEL register is for selecting which module is going to be the module under test; the TINREG register is used for latching the test data to the module's logic; the TINSEL register controls which of the TINREG bits are to be driven directly by the TINBUS; and the TOUTSEL register is used to control the test output drivers for writing test results onto the TOUTBUS. In addition to those signals shown in the table, to write to the TINREG, TINSEL or the TOUTSEL registers requires that the MSA signal be in a high logic state for the particular module housing those registers which are to be written to.

Whereas many alternatives and modifications of the present invention will no doubt become apparent to a person of ordinary skill in the art after having read the foregoing description, it is to be understood that the particular embodiments shown and described by way of illustration are in no way to be considered limiting. Reference to the details of the preferred embodiment are not intended to limit the scope of the claims which themselves recite only those features regarded as essential to the invention.

What is claimed is:

1. An integrated circuit implemented on a chip comprising:
    a plurality of chip inputs coupled to the integrated circuit for routing signals into circuitry embedded on the chip;
    a plurality of chip outputs coupled to the integrated circuit for routing signals out of the chip;
    a first circuit module incorporated on said chip, said first circuit module including:
        module logic incorporated within said first circuit module;
        module system inputs coupled to said first circuit module for routing system signals to said module logic;
        test signal inputs coupled to said first circuit module for routing test signals to said module logic;
        module system outputs coupled to said first circuit module for routing system signals out of said first module; and
        test signal outputs coupled to said first circuit module for routine test signals out of said module logic;
    a test input bus coupled to said first circuit module at said test signal inputs and selectively coupled to at least one of said plurality of chip input for transmitting test control signals to control said integrated circuit when said integrated circuit is being tested;
    a test output bus coupled to said first circuit module at said test signal outputs and selectively coupled to at least one of said plurality of chip outputs for transmitting a test result signal from said first circuit module out of said integrated circuit;
    a test module select logic coupled within said first circuit module and to said test input bus for generating a module select active signal internal to said first circuit module responsive to signals from said test input bus identifying said first circuit module as a module under test when said first circuit module is selected to be tested;
    a test input logic coupled within said first circuit module and coupled to said test input bus through said test signal inputs and coupled to said module system inputs for receiving both test input signals and user mode input signals, said test input logic being further coupled to said module logic and to said test module select logic for controlling which signals are passed by said test input logic to said module logic; and
    a test output logic coupled within said first circuit module to said test module select logic, to said test output bus through said test signal outputs and to said module logic, said test output logic for controlling the transmission of said test result signal onto said test output bus when said first circuit module is being tested.

2. The integrated circuit of claim 1 further comprising an internal address/control bus coupled to said first circuit module and provided with direct access to said module logic for supplying said module logic with address and control signals during both normal operations and testing operations of said integrated circuit.

3. The integrated circuit of claim 1 wherein said first circuit module comprises a unique test address and said test module select logic comprises:
    a comparing means coupled to said test input bus for receiving test address signals and for comparing received test address signals to said unique test address of said first circuit module;
    a test select register coupled to said comparing means for latching a high logic value when said test address signals match said unique test address of said first circuit module; and
    a signal output means coupled to said test input logic and said test output logic and responsive to said test select register for indicating when said first circuit module has been selected as the module to be tested.

4. The integrated circuit of claim 3 wherein said comparing means comprises:
    a plurality of exclusive NOR gates coupled to said test input bus; and
    an AND gate coupled to each of said plurality of exclusive NOR gates and to said test select register for identifying when said test address signals from said test input bus match said unique test address of said first circuit module.

5. The integrated circuit of claim 1 wherein said test input logic comprises:
- a test input select logic circuit coupled through said test signal inputs to said test input bus for receiving test set control signals when said first module is being tested;
- a test input register coupled to said test input select logic circuit and further coupled through said test signal inputs to said test input bus for receiving and holding test input signals in selected bits of said test input register, said selected bits selected in response to said test set control signals; and
- a multiplexing means coupled to said test input register and said module system inputs for receiving input signals from both, said multiplexing means being coupled to said test module select logic to receive a control signal which determines which input signal said multiplexing means will pass to said module logic, said multiplexing means having an output coupled to said module logic.

6. The integrated circuit of claim 5 wherein said test input select logic circuit comprises:
- a test input select register coupled to said test input bus for receiving test set control signals that identify which bits of said test input register will be directly driven by said test input bus, said test input select register being further coupled to said test input register for enabling selected bits of said test input register to be directly driven by said test input bus in accordance with said test set control signals; and
- a control gate responsive to a plurality of system control signals and coupled to said test input select register to selectively enable said test input select register for receiving said test set control signals from said test input bus.

7. The integrated circuit of claim 5 further comprising means for using selected bits of said test input register for more than one test set.

8. The integrated circuit of claim 7 wherein said means for using selected bits of said test input register for more than one test set comprises OR gates coupled to the bits of said test input register for receiving a plurality of test set control signals from said test input select logic and enabling said bits to be directly driven by said test input bus in response to said test set control signals.

9. The integrated circuit of claim 8 further comprising a decoder coupled to said test input select register for decoding test set control signals when the number of test sets exceeds the bit width of said test bus.

10. The integrated circuit of claim 1 wherein said test output logic comprises:
- a test output register coupled to said test input bus for receiving test output control information;
- a test output driving means coupled to and responsive to said test output register, said test output driving means further coupled to said module logic and to said test output bus for routing outputs from said module logic onto said test output bus in response to signals from said test output register.

* * * * *

UNITED STATES PATENT AND TRADEMARK OFFICE
CERTIFICATE OF CORRECTION

PATENT NO. : 5,379,308
DATED : 1/3/95
INVENTOR(S) : Hang T. T. Nguyen and Srinivas Raman It is certified that error appears in the above-indentified patent and that said Letters Patent is hereby corrected as shown below:

On the title page, item [75] Inventor: Delete "Hang T. T. Nhuyen" and insert --Hang T. T. Nguyen--.

Signed and Sealed this

Seventeenth Day of October, 1995

Attest:

BRUCE LEHMAN

Attesting Officer

Commissioner of Patents and Trademarks